US 8,433,823 B2

(12) United States Patent
Hugly et al.

(10) Patent No.: US 8,433,823 B2
(45) Date of Patent: Apr. 30, 2013

(54) RANDOM ACCESS DATA COMPRESSION

(75) Inventors: Jean-Christophe Roger Hugly, Mountain View, CA (US); Stephen Manley, Livermore, CA (US)

(73) Assignee: TIBCO Software Inc., Delaware, MD (US)

( * ) Notice: Subject to any disclaimer, the term of this patent is extended or adjusted under 35 U.S.C. 154(b) by 0 days.

(21) Appl. No.: 13/225,261

(22) Filed: Sep. 2, 2011

(65) Prior Publication Data

US 2012/0109909 A1 May 3, 2012

Related U.S. Application Data

(60) Provisional application No. 61/380,164, filed on Sep. 3, 2010.

(51) Int. Cl.
*G06F 17/30* (2006.01)

(52) U.S. Cl.
USPC .......................................... 709/247; 711/171

(58) Field of Classification Search .................. 709/247; 711/171
See application file for complete search history.

(56) References Cited

U.S. PATENT DOCUMENTS

| 5,155,484 | A  |   | 10/1992 | Chambers, IV |         |
|-----------|----|---|---------|--------------|---------|
| 5,613,091 | A  | * | 3/1997  | Stone et al. ................... | 711/171 |
| 6,157,743 | A  | * | 12/2000 | Goris et al. ................... | 382/233 |
| 6,757,802 | B2 | * | 6/2004  | Trainin et al. ................ | 711/170 |
| 7,058,783 | B2 | * | 6/2006  | Chandrasekaran et al. .. | 711/171 |
| 7,260,150 | B2 | * | 8/2007  | Katsavounidis et al. | 375/240.28 |
| 7,423,649 | B2 | * | 9/2008  | Henocq et al. ................ | 345/473 |
| 7,451,290 | B2 | * | 11/2008 | Chandrasekaran et al. .. | 711/171 |
| 7,516,230 | B2 | * | 4/2009  | Sperschneider et al. ...... | 709/231 |
| 7,664,881 | B2 | * | 2/2010  | Le Pennec et al. ........... | 709/247 |
| 7,743,102 | B1 | * | 6/2010  | Yohe et al. .................... | 709/206 |
| 7,801,363 | B2 | * | 9/2010  | Hong et al. ................... | 382/232 |
| 2007/0061546 | A1 |  | 3/2007 | Berger et al. | |

FOREIGN PATENT DOCUMENTS

WO 2007/138599 12/2007

OTHER PUBLICATIONS

The HDF Group (THG): HDF5 User s Guide Release 1.6.6, Internet Citation, Aug. 1, 2007 p. 246pp, URL:http://www.hclfgroup.org/HDF5/cloc1.6/PSandPDF/ HDF5_UG_r166.pdf.

"Appnote.txt—.zip file format specification", Internet Citation, Jan. 11, 2001, URL:http://www.the7soft.com/file-formats/file-formats-ArchJvers/zip45.zip.

PCT Notification of Transmittal of the International Search Report and the Written Opinion of the International Searching Authority, or the Declaration for International Application No. PCT/US2011/050434, mailed Jan. 2, 2012, 11 pages.

* cited by examiner

*Primary Examiner* — Kim Nguyen

(57) ABSTRACT

Methods, program products, and systems implementing random access data compression are disclosed. Data can be stored in a data structure in compressed or non-compressed form. The data structure can include a header block, one or more data blocks, and one or more index blocks. Each data block can include data compressed using different compression technology. The header block can include searchable references to the data blocks, which can be located in the data structure after the header block. The searchable references permit non-sequential access to the data blocks. The data blocks can be organized independent of a file system structure. The header block can additionally include references to the one or more index blocks, which can expand the references in the header block.

20 Claims, 15 Drawing Sheets

RANDOM ACCESS DATA COMPRESSION

CROSS REFERENCE TO RELATED APPLICATION

This application claims the benefit under 35 U.S.C. §119(e) of U.S. Patent Application No. 61/380,164, filed Sep. 3, 2010, entitled "Random Access Data Compression," which is incorporated by reference herein in its entirety.

TECHNICAL FIELD

This disclosure relates generally to data management.

BACKGROUND

Data compression is a process of encoding information that can be represented using fewer bits than an uncompressed representation of the information. Conventional encoding schemes can specify how the information is compressed. Conventional encoding schemes can use adaptive models and generate variable-bit-length codes that are decoded sequentially from beginning to end. To access data within the compressed representation, a user can decompress the compressed representation up to the location of that data. When the compressed representation is a large file, the decompression can include reading gigabytes (GBs) of data.

For an uncompressed file, the user can directly access any offset of data in the file in substantially equal time, skipping past information that the user does not need. When storing data, the user can decide whether or not to compress the data. Storing the data compressed reduces the amount of storage space needed to store the data and increases access time due to the need to decompress. Storing the data uncompressed uses more storage space than compressed data, and allows random, and thus speedier access of information.

SUMMARY

Methods, program products, and systems implementing random access data compression are disclosed. Data can be stored in a data structure in compressed or non-compressed form. The data structure can include a header block, one or more data blocks, and one or more index blocks. Each data block can include data compressed using different compression technology. The header block can include searchable references to the data blocks, which can be located in the data structure after the header block. The searchable references permit non-sequential access to the data blocks. The data blocks can be organized independent of a file system structure. The header block can additionally include references to the one or more index blocks, which can expand the references in the header block.

These and other implementations can be utilized to achieve one or more of the following advantages. Random access data compression can allow dynamic compression. The data to be compressed can include log data of various log sources (e.g., devices, operating systems, or applications). The log data can be received continuously. The log data can be compressed as they arrive. The compressed log data can be accessed out of sequence. The access only uses a minimum number of seeks, often no more than one per random access. Reading unwanted data can be minimized or avoided.

Random access data compression permits hardware flexibility. A wide variety of storage systems including external arrays, solid-state drives (SSDs), and distributed storage can be supported concurrently. Random access data compression allows easy data migration. A storage device can become full, causing data to be purged or moved to alternative storage devices. To facilitate the purge and move, random access data compression can provide effective mechanisms for recovering space occupied by expired data.

Random access data compression can support various data purging policies. A user may desire or be required to purge data after a certain time. The length of time can vary by type of data. Random access data compression can provide features to classify the data in such a way that erasing, selective recycling or obfuscating is economical.

Random access data compression can be resilient to unplanned shutdown. Loss of data previously committed to a non-volatile storage device (e.g., a disk) can be minimized or avoided except for failure of the non-volatile storage device. Loss of referential integrity and metadata, including grouping of data as intended by a user, can be likewise minimized or avoided.

The details of one or more implementations of random access data compression techniques are set forth in the accompanying drawings and the description below. Other features, aspects, and advantages of random access data compression will become apparent from the description, the drawings, and the claims.

BRIEF DESCRIPTION OF THE DRAWINGS

Like reference symbols in the various drawings indicate like elements.

DETAILED DESCRIPTION

Exemplary File Format

Figure 1:
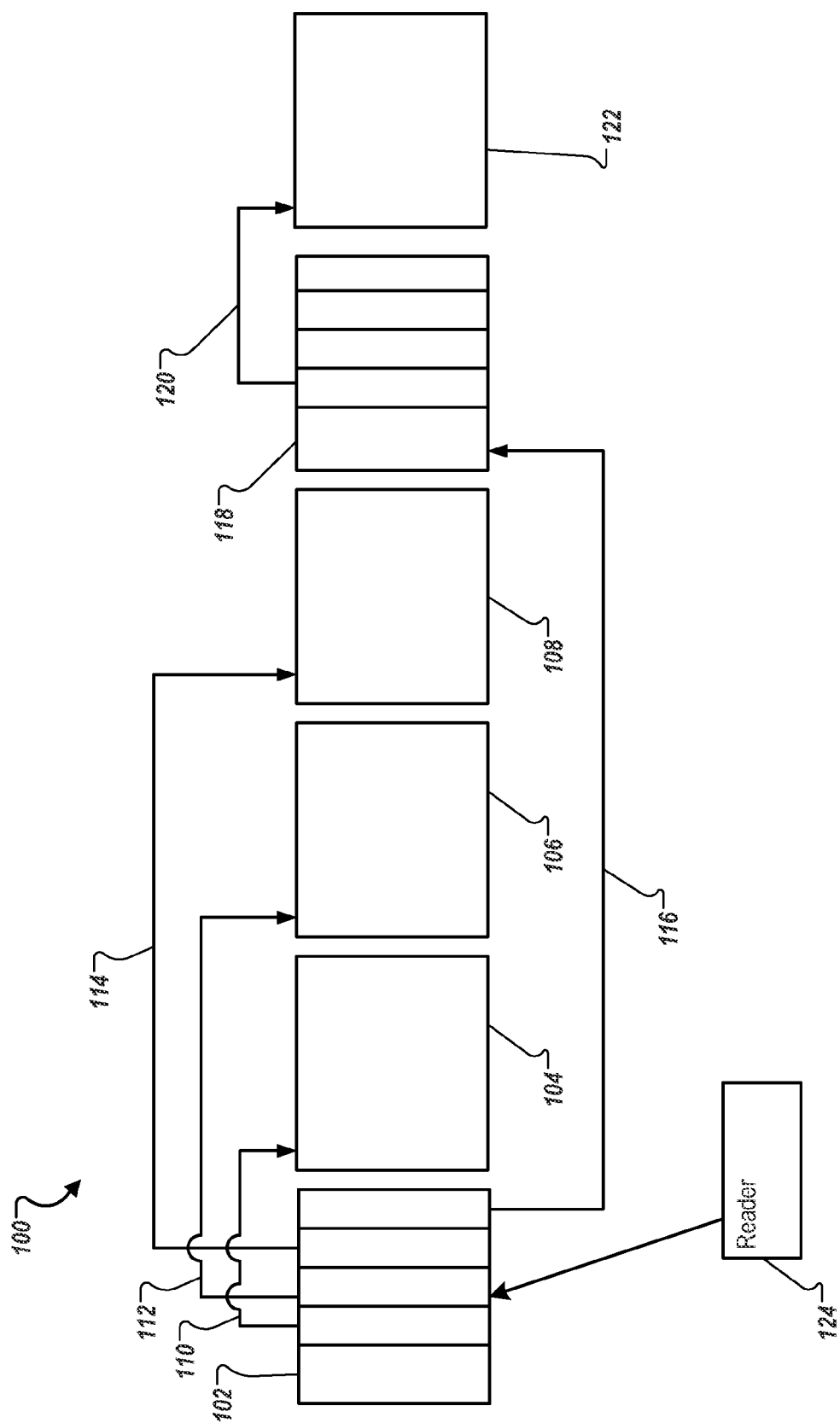
FIG. 1 is a block diagram illustrating an exemplary data structure used in random access data compression.

FIG. 1 is a block diagram illustrating an exemplary data structure 100 used in random access data compression. Data structure 100 can include one or more portions of a file, or one or more files. Data structure 100 can include compressed data, uncompressed data, or both. Data structure 100 can be serialized, have a tree structure, or be structured in any other form.

Data structure 100 can include header block 102, which can be stored at the beginning of the data structure 100 when serialized, or at an entry point of data structure 100 if data structure 100 is not serialized. Data structure 100 can include data blocks 104, 106, and 108. Each of data blocks 104, 106, and 108 can be stored after header block 102 in serialized data structure 100. Each of data blocks 104, 106, and 108, can store compressed data. Each of data blocks 104, 106, and 108 can store data compressed using a compression format that is different from another data block.

Header block 102 can include references 110, 112, and 114 that refer to data blocks 104, 106, and 108, respectively. A reference to a data block can designate a unique point in data structure 100. The designation can have a byte granularity. The reference can be stored in header block 102 and associated with information that can identify the data block referenced. The information can include a data offset.

Header block 102, as well as each of data blocks 104, 106, and 108, can have a configurable block size. The size can be stored in header block 102. Compressed data can require multiple data blocks when the size of the compressed data is large compared to the size of a data block. The quantity of references to the data blocks, accordingly, can be larger than can be stored in header block 102. Header block 102 can store reference 116 to index block 118. Index block 118 can act as an extension of header block 102. For example, index block 118 includes reference 120 to data block 122. Index block 118 can include one or more references to other index blocks, forming a tree. In some implementations, reference 116 to index block 118 can be a last reference stored in header block 102.

Data structure 100 can allow random access to compressed or uncompressed data. In some implementations, the data to be compressed can include log data that, in turn, includes one or more data messages, each data message having an offset to the beginning of the log data or to a marker. If a particular data message is to be accessed, reader 124 can access header block 102. Using offset information of the particular data message, reader 124 can identify a data block (e.g., data block 122) where the particular data message is stored in compressed format. Reader 124 can follow the reference to the identified block and access the data message without having to read and decompress data blocks (e.g., data blocks 104, 106, and 108) stored before the identified data block.

Compressed data can be stored in storage containers as storage units. The storage containers can include one or more file system directories, or one or more virtual blocks, or both. Storage units can include the various blocks and indices organized using data structure 100 of FIG. 1. Storage units and storage containers can be associated together by one or more block accessors. Further details on the block containers, block accessors, and storage units will be described below.

Exemplary Storage Container

Figure 2A:
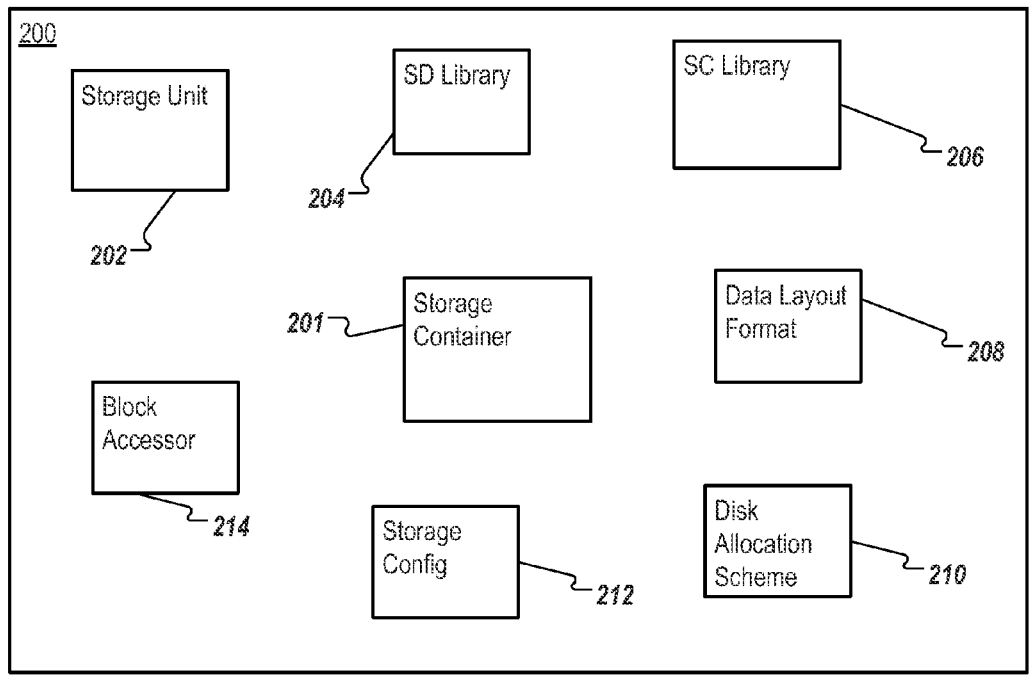
FIG. 2A is a block diagram illustrating various components of an exemplary system implementing random access data compression.

FIG. 2A is a block diagram illustrating various components of exemplary system 200 implementing random access data compression. System 200 can include storage container 201. Storage container 201 can be an operating system storage facility that is being used to store one or more storage units. Storage container 201 can include a directory in a mounted file system or a block device. A block device can be a virtually defined storage facility. Storage container 201 can additionally or alternatively include a block device image that is a file of fixed size, which can be treated as if it were a block device. Storage container 201 can include a variable-sized block device image or block device.

System 200 can include one or more storage units 202. Storage units 202 can be storage in storage container 201, along with information for managing and utilizing more storage units 202. Storage units 202 stored in storage container 201 can be identified by their pathnames. Other files can be ignored.

If storage container 201 is a block device, the list can be stored as a contiguous sequence of blocks. Storage units 202 can be identified and traversed using offsets from a first block (e.g., a header block). Other types of storage containers are possible.

A directory structure of storage container 201 can include a single-level hierarchy or a multi-level hierarchy. Names of storage units 202 can be tracked in subdirectories. Detailed characteristics and roles of each storage unit can be tracked in separate databases, or as file and directory names. To minimize directory search time, storage units 202 can be configured to be large and few.

System 200 can include storage directory library 204. Storage directory library 204 can manage one or more lists of storage units 202 within storage container 201. Storage directory library 204 can hide differences between types of storage containers 201 behind a single directory application programming interface (API). The API can allow system 200 to assign a unique name to a unique storage unit 202, find a storage unit 202 by name, and remove an association between a storage unit 202 and a name. Storage directory library 204 can depend on storage container library 206 to allocate space in storage containers 201 for the directory structure.

System 200 can include storage container library 206. Storage container library 206 can be used to manipulate storage container 201. Storage container library 206 can provide mechanisms to allocate and access blocks for the supported classes of storage containers and implement storage units in data layout format 208 on top of various storage containers. Storage container library 206 can be used to manipulate an individual storage unit 202. Storage container library 206 can be used as a zlib drop-in replacement.

System 200 can include storage container configuration 212. Storage container configuration 212 can include a map of a storage container that a given instance of storage service can use. The map can include a set of records. Each record can include a pathname of storage container 201, a type of storage container 201, and an open-ended set of attributes. The type of storage container 201 can denote which block accessor 214 and directory handling logic can be used. Storage configuration 202 can be represented as a block of American Standard Code for Information Interchange (ASCII) text with the following Extended Backus-Naur Form (EBNF) grammar:

```
config = { line };
line = { whitespace }, pathname, whitespace, type, { whitespace,
    attributes }, { whitespace }'\n';
type = "directory" | "image" | "image-growable" | "bdev" |
    "bdev-growable";
attributes = attribute, { whitespace, attribute };
attribute = key, { whitespace }, '=', { whitespace}, value;
key = allowedchar, { allowedchar };
value = allowedchar, { allowedchar };
allowedchar = anybyte – ('=' | ' ' | '\n' | 0 );
whitespace = ' ', { ' ' };
pathname = pathnamebyte, { pathnamebyte };
pathnamebyte = anybyte – (' ' | '\n' | 0);
anybyte = ? any 8 bit value ?;
```

Storage unit 202 and a directory can be configured to function independently of each other. Storage container 201 can be a source of the storage blocks that are managed by block accessor 214.

Disk allocation scheme 210 can support various classes of storage container 201. The classes can include a block device class and a file directory class. Storage directory library 204 can store a directory in a manner specific to a storage container class. If storage container 201 is a directory of a file system, storage unit 202 can be a file within that directory. If storage container 201 is a block device or block device image, storage unit 202 can include one or more continuous blocks of n kilobytes (KB) each, where n is a unit of allocation set by block accessor 214. Modifications to a storage container's list of storage units can be flushed to a non-volatile storage device (e.g., a disk).

Figure 2B:
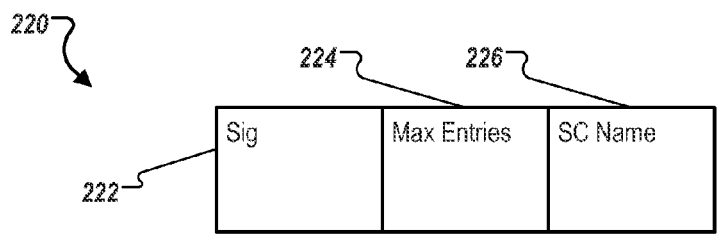
FIGS. 2B-2C are diagrams illustrating exemplary directory representations of a block device type of storage container used in random access data compression.
Figure 2C:
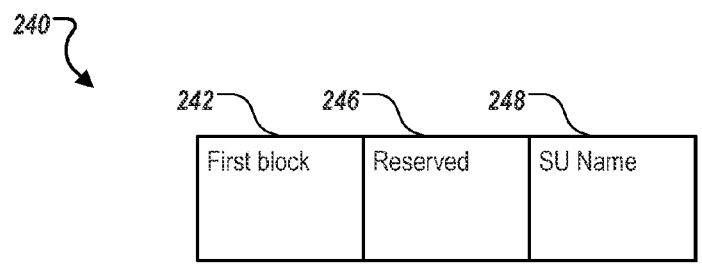

FIGS. 2B-2C are diagrams illustrating exemplary directory representations of a block device type storage container used in random access data compression. FIG. 2B illustrates an exemplary format of header 220 of the directory. Header 220 of directory can be different from a header block of a storage unit. Header 220 can include signature 222. Signature 222 can include a unique number having a specified length (e.g., eight bytes). Signature 222 can be used for detecting corrupted or un-initialized storage units.

Header 220 can include maximum entries value 224. Maximum entries value 224 can specify a number of entries of an array of a storage unit array. In some implementations, maximum entries value 224 can be represented as an eight-byte big-endian value.

Header 220 can include storage container name 226. Storage container name 226 can be a name of the block device storage container. In some implementations, storage container name 226 can include a null-terminated string of at most a specified length (e.g., 240-bytes) including the final zero. An array of fixed size data records can follow header 220.

FIG. 2C illustrates an exemplary entry of a directory. Data record 240 of a storage container can be different from a data block of a storage unit. Data record 240 can include first block offset value 242. First block offset value 242 can indicate an offset to a first block in a storage unit. The unit of the offset can be in bytes. In some implementations, first block offset value 242 can be an eight-byte big-endian value. The first block can be expressed in bytes for easier development and debugging.

Data record 240 can include reserved space 246. Reserved space 246 can be a fixed-length location (e.g., eight bytes) for extensions. The extension can enable larger offsets when a full storage is copied to a block device that is larger than 2^64 bytes. Additionally or alternatively, the extension can be used to extend storage unit entries to include additional information on another block, or to link to secondary storage units.

Data record 240 can include storage unit name 248. Storage unit name 248 can include a null terminated string of at most a specified length (e.g., 240-bytes) including the final zero. An empty string in storage unit name 248 can indicate an unused entry.

A storage container can have a file system directory class. Contents of the directory can include a block of ASCII text with the following grammar:

```
directory = header, body;
header = { whitespace }, name, { whitespace }, '\n';
```

-continued

```
body = { entry };
entry = { whitespace }, name, whitespace, pathname, { whitespace }, '\n';
allowedchar = anybyte - ( ' ' | '\n' | 0 );
whitespace = ' ', { ' ' };
name = { allowedchar };
pathname = pathnamebyte, { pathnamebyte };
pathnamebyte = anybyte - ( ' ' | '\n' | 0 );
anybyte = ? any 8 bit value ?;
```

Exemplary Block Accessor

Figure 3A:
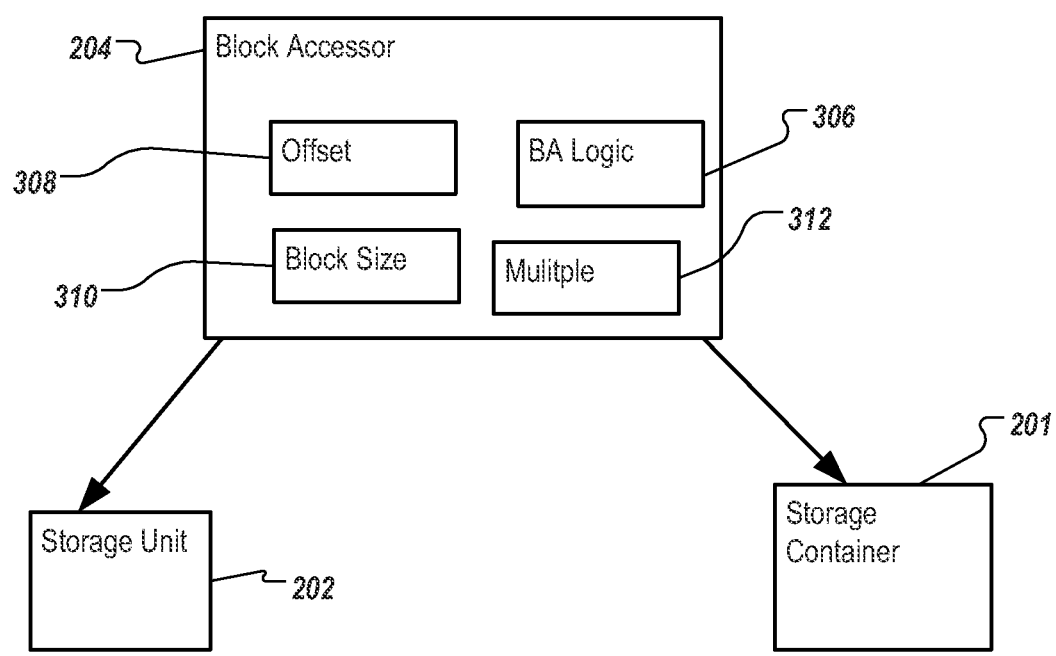
FIGS. 3A-3C are diagrams illustrating exemplary block accessors used in random access data compression.

FIG. 3A is a diagram illustrating exemplary block accessor 214 used in random access data compression. Each type of storage container can be associated with logic to allocate, access and release blocks for use by given storage units. Block accessor 214 can specify and manage the association between storage unit 202 and storage container 201. For example, block accessor 214 can include logic to translate a reference designating a unique point of data to unique point that has been designated. Block accessor 214 can include block accessor logic 306 that corresponds to a particular type of storage container 201. A given block accessor state can be shared by multiple storage units or be specific to one storage unit or a combination of both.

A block can include a section of storage space that is regarded as contiguous by storage unit 202. The block can be, but need not be, a single hard disk block. Block accessor 214 can provide data access methods to read, write, and seek into blocks. In some implementations, a single block can include underlying physical storage that is not physically contiguous.

Storage unit 202 can be associated with block accessor 214. Storage unit 202 can designate blocks using offset 308, block size 310, or both, that are provided by associated block accessor 214. Storage unit 202 can assume that the offset-size pair represents a portion of the underlying physical storage that belongs exclusively to storage unit 202. Storage unit 202 can use block accessor 214 to seek to these offsets at specified location, and read and modify bytes at the location. Offset 308 of a block can be relative to a specified point. The specified point can be the beginning of a file containing only one storage unit, or the beginning of a block device containing many storage units. The knowledge of offset 308 can belong to block accessor 214 that is associated with storage unit 202.

For example, if storage container 201 is a file in a file system, block accessor 214 can include the file. Block accessor 214 can use truncate to add/remove blocks from storage unit 202, and use seek, read, and write relative to the beginning of the file to access information in storage unit 202.

If storage container 201 is a block device, block accessor 214 can allocate blocks from the device by maintaining a free list or a bitmap on the block device. Block accessor 214 can use seek, read, and write relative to the beginning of the block device to access the information in storage unit 202.

A storage container library can hide differences between types of storage containers behind a single block accessor API to allocate blocks for storage unit 202, depending upon the type of storage container 201 associated with storage unit 202. Block accessor 214 need not manipulate internal structure of storage unit 202 during allocation. Storage unit logic can be responsible for maintaining references to all blocks that have been allocated.

Block accessor logic 306 can include allocation and release functions. In addition, block accessor logic 306 used for accessing blocks in a file-based storage unit and blocks in a block-device based storage unit can include native file manipulation functions, e.g., seek( ), read( ), or write( ). It is not required, though desirable, that the storage underlying successive blocks of storage unit 202 be sequential and contiguous. Sequential and contiguous blocks can result from optimizations in a block device block accessor.

Block accessor 214 can include block size 310 that block accessor 214 supports for associated storage container 201 and how many multiples 312 of block size 310 block accessor 214 can allocate at one time. In some implementations, block accessor 214 can support any block size and thus can indicate that block size 310 has a value of 1, and multiple 312 has a value of 2^64.

In some implementations, block accessor 214 can choose block size 310 and multiple 312 when initializing storage container 201. Block accessor 214 can record block size 310 and multiple 312 in a manner specific to a class of block accessor 214. Subsequent instantiations of storage container 201 can be configured to report the initially chosen block size 310 and multiple 312.

Storage container types specified by block accessor 214 can include the following:
A directory inside file-system (first implementation);
A fixed size file;
A block device;
A growable block device (e.g., a logical volume)
A growable file (e.g., logical volume image)

A block device class of block accessor 214 can support a single block size (a multiple of 1) for all storage units in a given storage container (e.g., storage container 201). When storage unit 202 is created, block size 310 can be chosen for storage unit 202 within constraints indicated by block accessor 214. The chosen block size can be recorded with storage unit 202 and can remain constant for storage unit 202. For file system storage containers, storage units can be moved from a first storage container to a second storage container. For block device storage containers, the block size in the storage unit can be used for error checking, allowing for the possibility that a tool can copy the storage unit from one storage container to another.

Figure 3B:
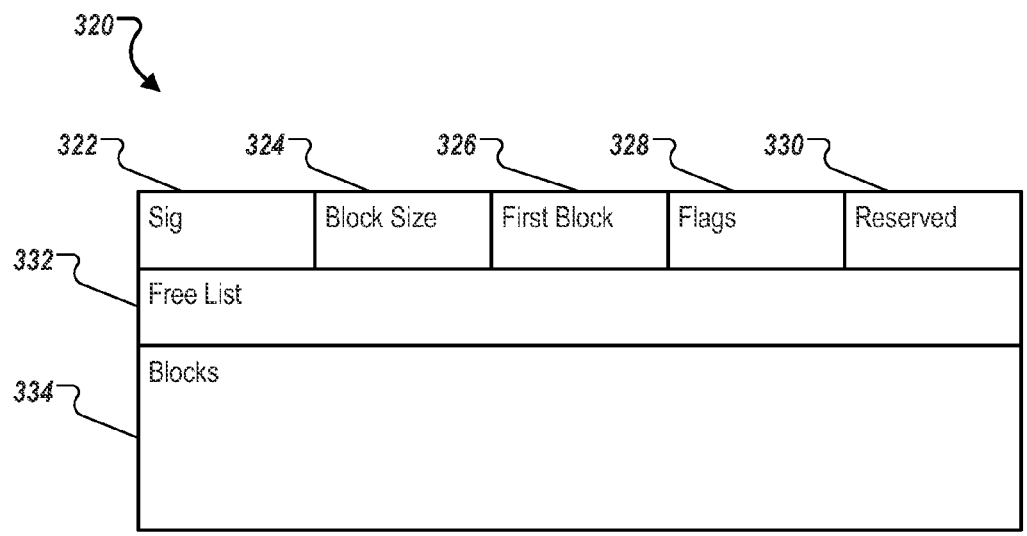

FIG. 3B is a diagram illustrating an exemplary structure 320 used by a block device block accessor in random access data compression. The block accessor can correspond to a block device class of a storage container. Structure 320 can include storage space used by the storage container. Structure 320 can include signature 322. Signature 322 can include a unique number having a specified length (e.g., eight bytes). Signature 322 can be used for detecting corrupted or un-initialized storage units.

Structure 320 can include block size 324. Block size 324 can represent units of storage allocated in a storage container associated with structure 320. Block size 324 can include an eight-byte big-endian number.

Structure 320 can include first block offset 326. First block offset 326 can include an offset of an entry point into stored content. The offset of the entry point can be an offset of a storage unit or a list of storage units associated with a storage container associated with structure 320. Block accessor logic can provide methods to set/get first block.

Structure 320 can include flags 328. Flags 328 can include one-byte values, which can include a bitmap. A first bit (e.g., bit 0) of the bitmap can store a dirty flag. If the dirty flag is found to be set when opening an associated storage container, the dirty flag can indicate that the storage container was not closed properly. The dirty flag can be cleared when the storage container has been cleaned and the system is shut down properly. A second bit (e.g., bit 1) of the bitmap can be a garbage collection (GC) flag. If the GC flag is found to be set when opening an associated storage container, garbage collection can be performed on the associated storage container. The GC flag can be cleared when the storage container has been cleaned and the system is shut down gracefully. Block accessor logic can manage the dirty and GC flags. Block accessor logic can provide functions for checking the GC flag and accomplish garbage collecting.

Structure 320 can include reserved section 330. Reserved section 330 can be set aside to allow a storage unit to store block type and flags at the very beginning of a block. Such arrangement can allow a storage unit format to be recognizable at the beginning of a file.

Structure 320 can include free list 332. Free list 332 can include a bit map of allocatable block in an associated storage container. Let T be the total number of bytes in the storage container; B be the block size; S be a size of free list 332 in bytes. Then the size of free list 332 can be calculated using the formula S=T/(8*B+1). Recovery of free list 332 can be automatic. Free list 332 can be brittle. Free list 332 can be committed to non-volatile storage rarely. If the dirty flag is detected upon startup, free list 332 can be rebuilt entirely from an owner field of a block accessor block, after which each storage unit can be repaired. Structure 320 can include blocks 334, which can include actual space being allocated to data. Blocks 334 can be aligned on block boundaries.

Figure 3C:
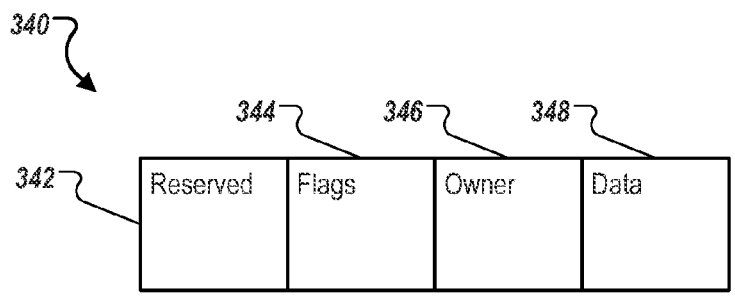

FIG. 3C illustrates an exemplary format of block container block 340. Block container block 340 can have a format identical to other forms of blocks (e.g., a block of a storage unit). At least a portion of data stored in block container block 340 can have meaning to a block accessor.

Block container block 340 can include reserved space 342. Reserved space 342 can be used by other types of blocks. Reserved space 342 can be seven-bytes long.

Block container block 340 can include flags 344. Flags 344 can be a one-byte value. A first bit (e.g., bit 0) of flags 344 can be a mark used by both a storage unit and a block accessor during garbage collection. If set, this block can be freed during a sweep.

Block container block 340 can include owner 346. Owner 346 can include a unique identifier supplied by an invoking party during allocation. Owner 346 can identify a storage unit associated with the block accessor. If the value is −1, the storage unit is unallocated. Owner 346 can include eight-bytes. Block container block 340 can include data section 348, which can store any data.

Exemplary Storage Unit

Figure 4:
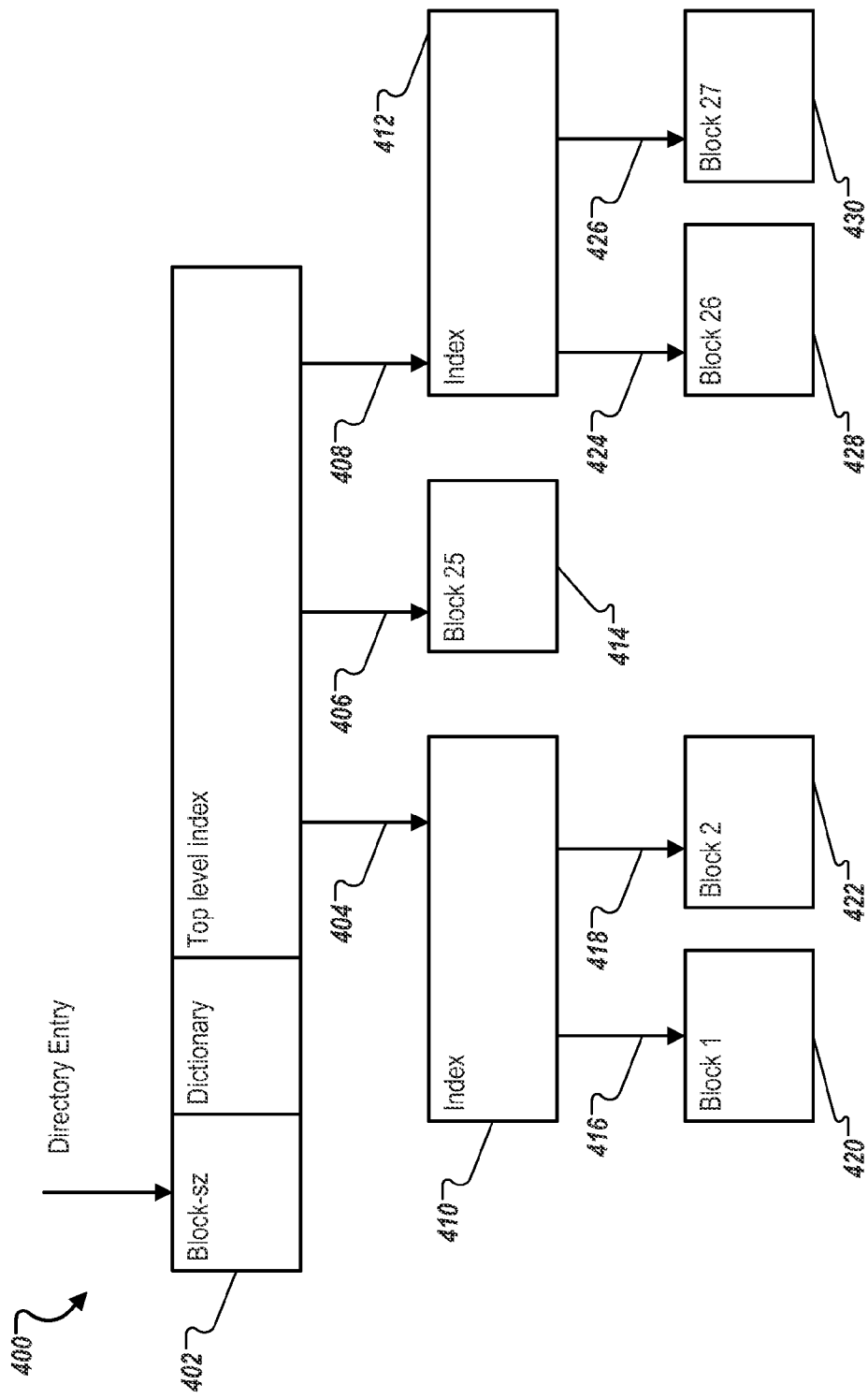
FIG. 4 is a diagram illustrating an exemplary structure of a storage unit used in random access data compression.

FIG. 4 is a diagram illustrating exemplary structure 400 of a storage unit used in random access data compression. A storage unit can represent a sequence of bytes. The storage unit can be organized as a set of blocks connected to each other. The blocks can include header blocks, data blocks, and index blocks. If a storage container associated with the storage unit is a directory in a file system, the storage unit can include a file of the file system. The blocks can be portions of the file. If the storage container is a block device, the storage unit can include a cluster of disjoint blocks that are transitively connected using exemplary structure 400.

To reconstruct data, blocks in a storage unit can be traversed in order specified by one or more indices. First block 402 can be a block that is accessed using directory entry, which can be an offset used to designate the storage unit. First block 402 can include a block size, a compression dictionary, and a top level index. Within the top level index, entries 404, 406, and 408 can be sorted in order of sections of uncompressed data, which entries 404, 406, and 408 represent.

Entries 404, 406, and 408 can include references 404 and 408 to index blocks, and reference 406 to data block 414. Data block 414 can include compressed or uncompressed data.

Index blocks 410 and 412 can each include entries to smaller portion of the sections of the uncompressed data. For example, index blocks 410 can include index that includes references 416 and 418 to data blocks 420 and 422, respectively. Index blocks 412 can include index that includes references 424 and 426 to data blocks 428 and 430, respectively.

To find a given chunk of uncompressed data, a reader can perform a dichotomic search on top level index of first block 402, and then recursively on any index (e.g., indices of index blocks 410 and 412), until a data block is found. To traverse all data from start to finish, the reader can traverse an entire tree in a depth-first and left-to-right order. In some implementations, an entry (e.g., a last entry) of an index can refer to another index block. The size and data offset portion of the entry can be set to zero.

Exemplary Storage Blocks

Figure 5:
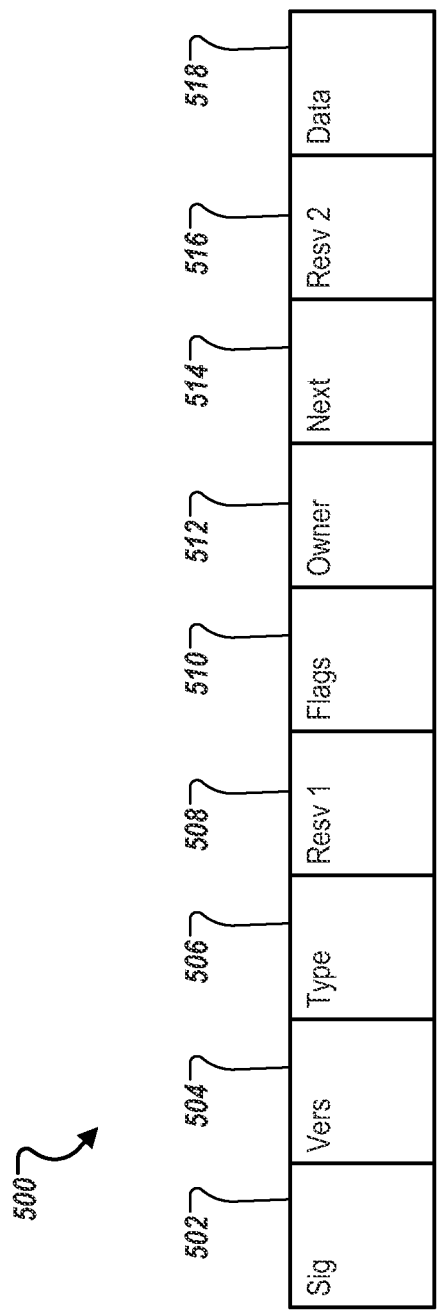
FIG. 5 is a diagram illustrating an exemplary structure of a block used in random access data compression.

FIG. 5 is a diagram illustrating an exemplary structure of block 500 used in random access data compression. In some implementations, data of a block can be contiguous. Any data within the block can be designated by adding an offset of the data within the block to an offset of the block. Multiple independent storages can be represented within a block device storage container as well as within a file system storage container. Multiple storage structures can co-exist.

Block 500 can include signature 502. Signature 502 can include a unique number having a specified length (e.g., two bytes). Signature 502 can be used for detecting corrupted or un-initialized storage units.

Block 500 can include version 504. Version 504 can include an indication of version of the structure (e.g., version 1).

Block 500 can include type 506. Type 506 can be a value having a specified length (e.g., one-byte) that can indicate how block 500 should be read. Some example type values are described below in table 1.

TABLE 1

| Value | Meaning |
| --- | --- |
| 0 | Invalid value |
| 1 | Block is a storage unit header block. A header block can be the first block of a storage unit. |
| 2 | Block is an index block. |
| 3 | Block is a data block including compressed data (e.g., ZLIB Compressed Data Format Specification version 3.3 (RFC1950) compressed data) |
| 4 | Block is a data block including uncompressed data. |
| 5 | Block is a data block including no data. |

Block 500 can include reserved space 508. Reserved space 508 can be used for future-proofing the structure of block 500. Reserved space 508 can have a specified length (e.g., three bytes).

Block 500 can include flags 510. Flags 510 can include a one-byte value, which can include a bitmap. A first bit (e.g., bit 0) of the bitmap can store a mark flag. The mark flag can be used during garbage collection. If the mark flag is set to one, block 500 will be swept at the end of the garbage collection. A second bit (e.g., bit 1) of the bitmap can be dirty flag. If the dirty flag is set in a header block, the dirty flag can indicate that the entire storage unit in which the header block is located is dirty.

Block 500 can include owner 512. Owner 512 can specify a storage unit to which block 500 belongs. A block can be designated by an offset of the first block of the storage unit. The first block (header block) can point to itself. Owner can have a specified length (e.g., eight bytes).

Block 500 can include reference 514. Reference 514 can include an offset to a next block in the storage unit. Reference 514 can be a big-endian value having a specified length (e.g., eight bytes).

Block 500 can include second reserved space 516. Second reserved space 516 can be used for future-proofing the structure of block 500. Second reserved space 516 can have a specified length (e.g., eight bytes).

Block 500 can include data space 518. Data space 518 can occupy remaining portions of block 500. Meaning of data stored in data space 518 can vary depending upon type 506 and flags 510 of block 500.

Figure 6A:
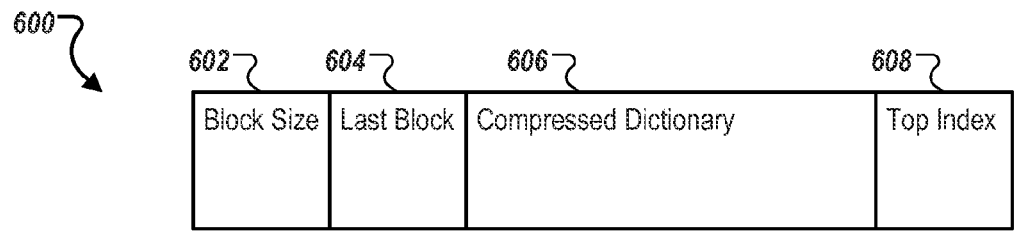
FIGS. 6A-6E are diagrams illustrating various types of blocks used in random access data compression.

FIGS. 6A-E are diagrams illustrating various types of blocks used in random access data compression. FIG. 6A is a diagram illustrating an exemplary structure of data section 600 of a header block. The header block can be designated by a specified type (e.g., type 1).

Data section 600 of a header block can include block size 602. Block size 602 can specify a size of all blocks of a storage unit that includes the header block. Block size 602 can include an eight-byte big-endian value.

Data section 600 of a header block can include last block reference 604. Last block reference 604 can include an offset of a last block in a block sequence in the storage unit. Last block reference 604 can include an eight-byte big-endian value.

Data section 600 of a header block can include dictionary 606. Dictionary 606 can include a dictionary that can be used as an initial dictionary for decompressing data blocks that specify the dictionary. The dictionary can be an RFC 1950 compressed dictionary. Dictionary 606 can be empty. A specified size (e.g., 32 kilobytes (KB)) can be allocated to dictionary 606 in data section 600.

Data section 600 of a header block can include top index 608. Top index 608 can occupy remaining portions of data section 600. Top index 608 can include a list of entries, each entry including a reference to another block in the storage unit. The reference can be an offset. Number of entries in top index 608 can depend on block size 602. For example, when block size 602 is 128 KB, top index 608 can accommodate 4095 entries. A storage unit using top index 608 as the only index can store approximately 500 megabytes (MBs) of compressed data.

Figure 6B:
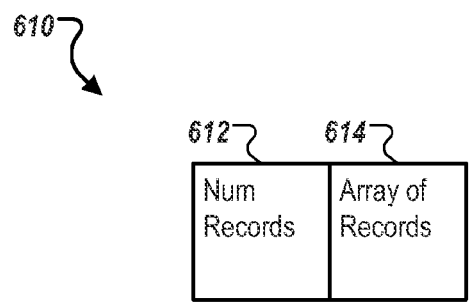

FIG. 6B is a diagram illustrating an exemplary structure of data section 610 of an index block. The index block can be designated by a specified type (e.g., type 2). Data section 610 of the index block can include record count 612. Record count 612 can indicate a number of records in the index block. Record count 612 can include a four-byte big-endian value.

Data section 610 of the index block can include a data structure 614 of records. Data structure 614 can include an array. Records can be stored in sequence in the array. The records that represent valid index entries can be stored at a beginning of the array. Other records having undefined content can follow.

Figure 6C:
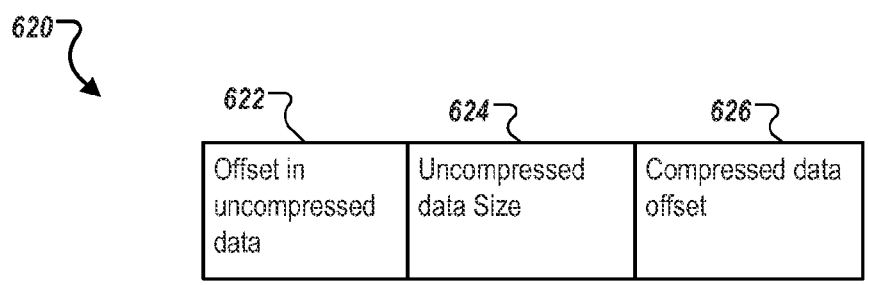

FIG. 6C is a diagram illustrating an exemplary structure of record 620 stored in an index block or in a top index portion of a header block. Record 620 can be a 24-byte space storing triplets of data.

Record 620 can include an offset in uncompressed data 622. Offset in uncompressed data 622 can indicate a beginning of a data section in uncompressed data. Offset in uncompressed data 622 can include an eight-byte big-endian value.

Record 620 can include uncompressed data size 624. Uncompressed data size 624 can indicate a size of the data section in uncompressed data. Uncompressed data size 624 can include an eight-byte big-endian value.

Record 620 can include compressed data block offset 626. Compressed data block offset 626 can include a reference to a block in storage that contains the data section in compressed form. Compressed data block offset 626 can include an eight-byte big-endian value.

Figure 6D:
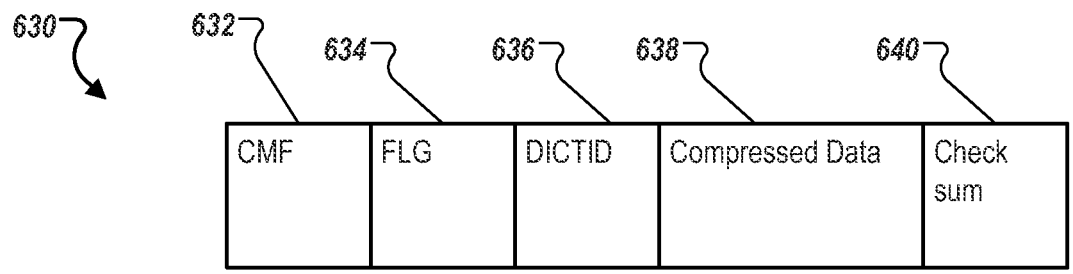

FIG. 6D is a diagram illustrating an exemplary structure of data section 630 of a compressed data block. The compressed data block can be designated by a specified type (e.g., type 3). The compressed data block can be decompressed using publicly available compression and decompression software (e.g., zlib).

Data section 630 of a compressed data block can include compression method and flags (CMF) 632. CMF 632 can be a one-byte long value that includes method of compression and compression information. Each data block can have a different CMF, allowing blocks of data to be compressed using different compression methods.

Data section 630 of a compressed data block can include flags 634. Flags 634 can include indication on dictionary and compression level. Flags 634 can occupy one byte.

Data section 630 of a compressed data block can include dictionary identifier 636. Dictionary identifier 636 can be present when a preset dictionary indicator bit of flags 634 is set. Dictionary identifier 636 can include a checksum of a dictionary that can be preloaded prior to decompressing data. If dictionary identifier 636 is present and a header block of the storage unit does not contain a matching dictionary, an error message can be generated, indicating that the storage unit or the data block is broken.

Data section 630 of a compressed data block can include compressed data 638 and checksum 640. Checksum 640 can include a checksum value of the uncompressed data (excluding any dictionary data) computed according to various algorithms (e.g., Adler-32 algorithm).

Figure 6E:
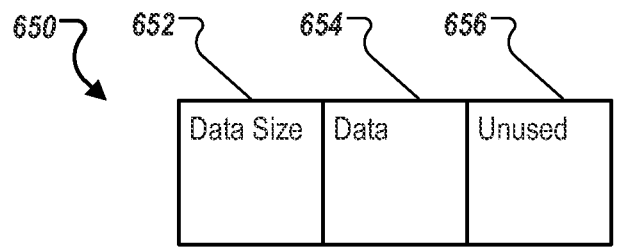

FIG. 6E is a diagram illustrating an exemplary structure of data section 650 of an uncompressed data block. Data section 650 of an uncompressed data block can include data size 652 that can indicate an amount of data in the uncompressed data block, actual uncompressed data 654, and unused section 656. A storage unit can include both a compressed data block and an uncompressed data block.

Exemplary Processes Implementing Random Access Data Compression

Figure 7A:
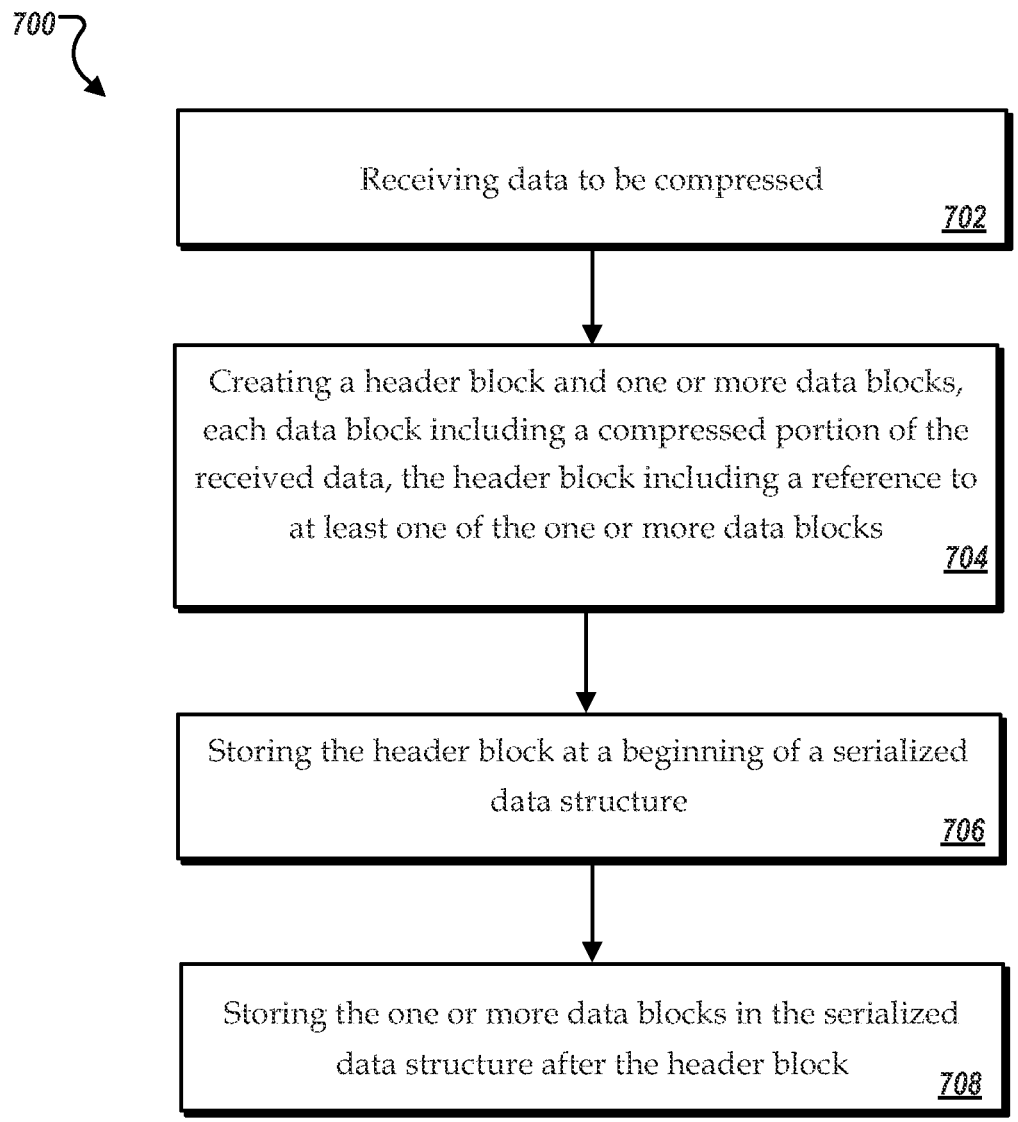
FIGS. 7A and 7B are flowcharts illustrating exemplary processes of storing and accessing randomly accessible compressed data.
Figure 7B:
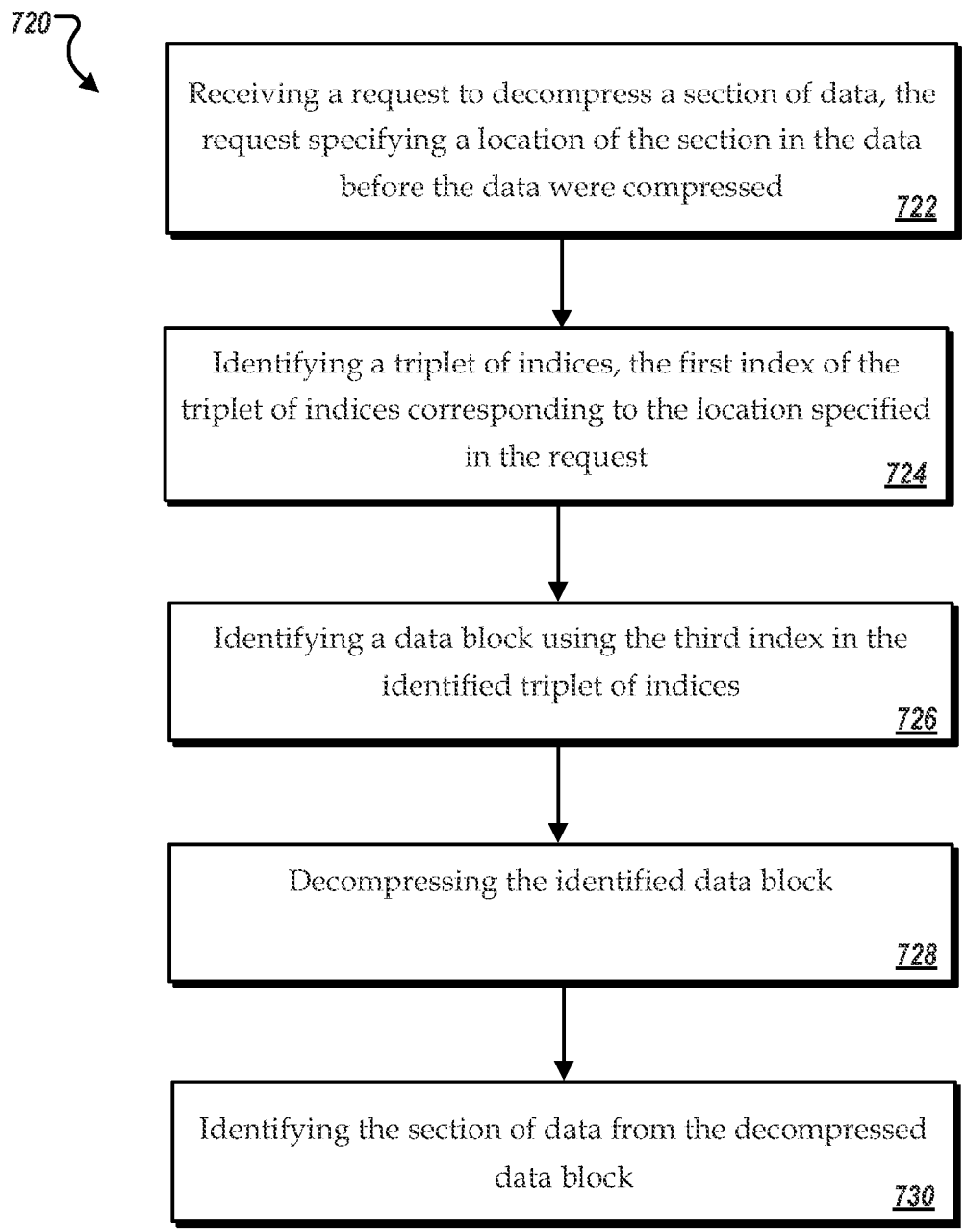

FIGS. 7A and 7B are flowcharts illustrating exemplary processes of storing and accessing randomly accessible compressed data. For convenience, the processes will be described using a system implementing the processes. The system can include one or more processing devices.

FIG. 7A is a flow chart illustrating exemplary process 700 of storing randomly accessible compressed data. The system can receive (702) data to be compressed. The data can include log data from a variety of log sources.

The system can create (704) a header block and one or more data blocks. Each data block can include a compressed or uncompressed portion of the received data. The header block can include an index to at least one of the one or more data blocks. The header block can include a configurable block size of each data block. The index can include a triplet of value. The indices can include a first index identifying an uncompressed offset value, a second index identifying an uncompressed data size, and a third index identifying an offset of a data block. In some implementations, the header block can include a reference to an index block, the index block including additional triplets of indices. The index block can be stored in the file after the at least one of the data blocks. The index block can include a reference to a next index block. The reference can be an offset value. The reference can be file system independent. A data block can include a compression identifier identifying a compression mechanism used in compressing the data into the data block. In some implementations, the one or more data blocks can include a first data block and a second data block. The first data block can include data compressed using a first compression mechanism. The second data block can include data compressed using a second compression mechanism that is different from the first compression mechanism.

The system can store (706) the header block in a data structure (e.g., at the entry point of the data structure). In some implementations, the data structure can be a serialized data structure. The data structure can include a file system directory or one or more files.

The system can store (708) storing the one or more data blocks in the data structure after the header block. Storing the one or more data blocks in the data structure after the header block can include storing the one or more data blocks sequentially after the header block. The index in the header block can indicate a location of each of the one or more data blocks in the data structure, allowing non-sequential access to each of the data blocks.

FIG. 7B is a flow chart illustrating exemplary process 720 of accessing randomly accessible compressed data. Accessing the data can include accessing a serialized data structure non-sequentially to retrieve data. The system can receive (722) a request to decompress a section of data stored in a compressed data file. The request can specify a location of the section in the data before the data were compressed. For example, the request can specify an offset of the section of the data and a size of the section of the data.

The system can identify (724) a triplet of indices, the first index of the triplet of indices corresponding to the location specified in the request. Identifying the triplet of indices can include traversing a header block and one or more index blocks of the compressed data, and identifying a top index and indices in the index blocks. Each index can include a collection of triplets of indices.

The system can identify (726) a data block using a reference in the identified triplet of indices. The reference can include an offset of a data block from the beginning of the compressed file or to the current block.

The system can decompress (728) the identified data block. Decompressing the identified data block can include decompressing the identified data block using a decompression method corresponding to a compression method as specified in the identified data block. In some implementations, the data block can include uncompressed data. Decompressing the identified data block can include retrieving the data from the data block.

The system can identify (730) the section of data from the decompressed data block, based on the offset and size specified in the request.

FIGS. 8A-8E are flowcharts illustrating exemplary processes of maintaining data integrity of random access data compression. For convenience, FIGS. 8A-8E will be described in reference to a system implementing the exemplary processes.

Figure 8A:
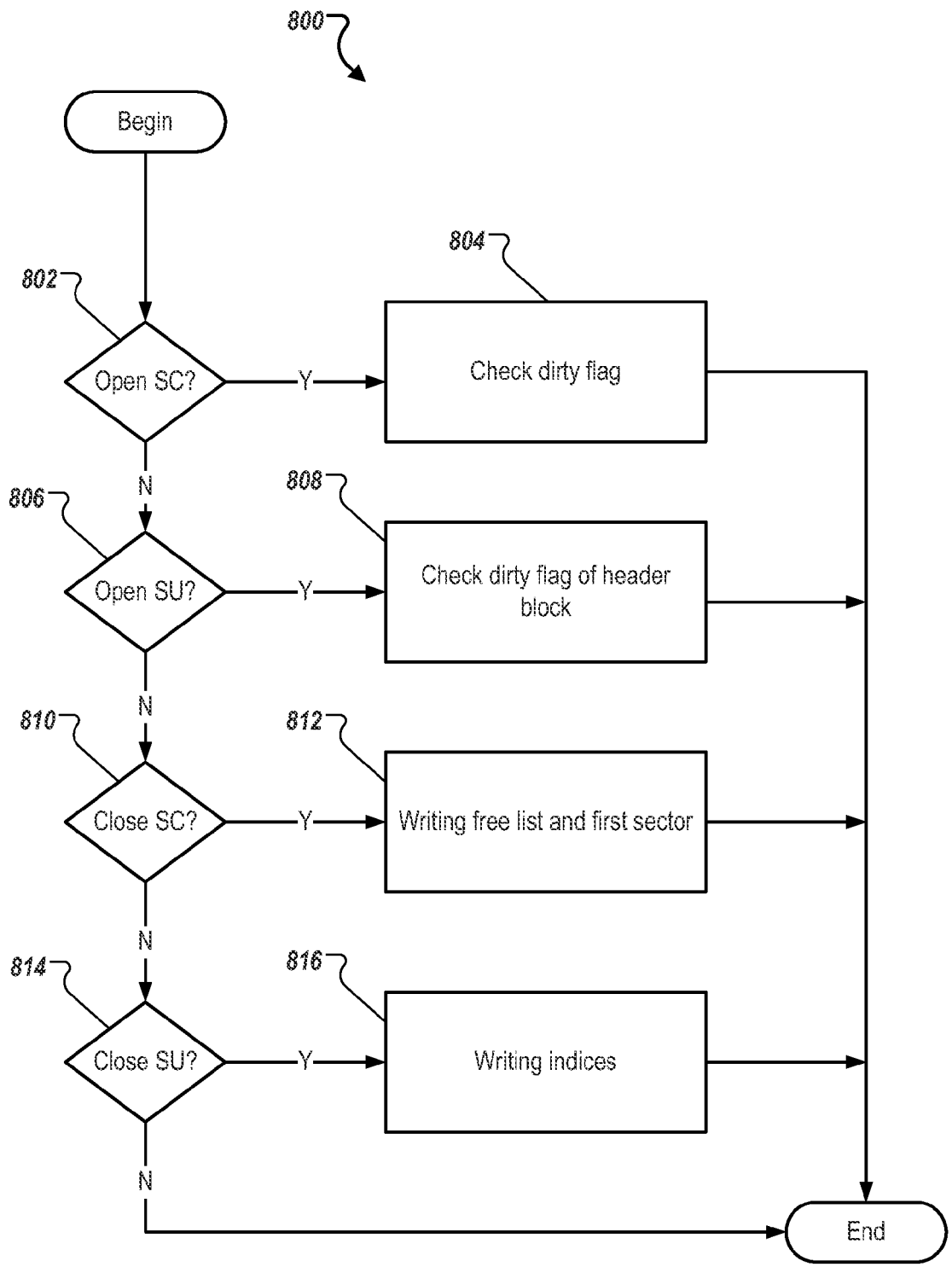
FIGS. 8A-8E are flowcharts illustrating exemplary processes of maintaining data integrity of random access data compression.

FIG. 8A is a flowchart illustrating exemplary process 800 of maintaining data integrity during opening and closing a storage container or storage unit. The system can determine (802) that a storage container is being opened. If a storage container is opened, the system checks (804) a dirty flag of the storage container. If the dirty flag is clear, the dirty flag can be set and the first sector of the storage container can be written and flushed.

The system can determine (806) that a storage unit is being opened. If a storage unit is being opened, the system can check (808) if a dirty flag of a header block of the storage unit is clear. If the dirty flag is clear, the system can set the dirty flag, and write and flush the storage unit. In some implementations, indices of a storage unit are kept in memory and updated in memory. The system writes headers of index blocks to record addition or deleting of index blocks.

The system can determine (810) that a storage container is being closed. If a storage container is being closed, the system can write (812) a free list and a first sector of the storage container. The system can issue a flush, which can write data that are designated to be written to non-volatile storage, but are still in volatile storage, to the non-volatile storage. The free list is written during closing. The free list can be kept and modified in memory at other time.

The system can determine (814) that a storage unit is being closed. If a storage unit is being closed, the system can write (816) indices in the index blocks or header unit or both. The system can issue a write barrier and write the first block of the storage unit.

Figure 8B:
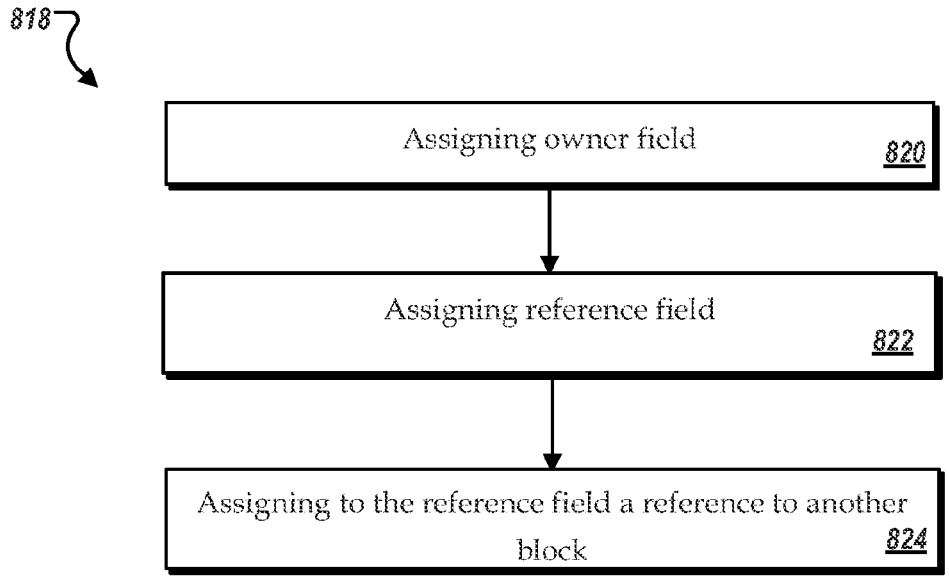

FIG. 8B illustrates exemplary process 818 of allocating a new block to a storage unit using a block device block accessor. A file system based block accessor can rely on a file system for assigning blocks to storage units.

A block accessor can assign (820) the owner field of the new block a reference to a new owner. The block accessor can assign (822) the reference field in a currently last block the reference to the new block. The block accessor can assign (824) the reference field of the new block with a reference to yet another block.

Figure 8C:
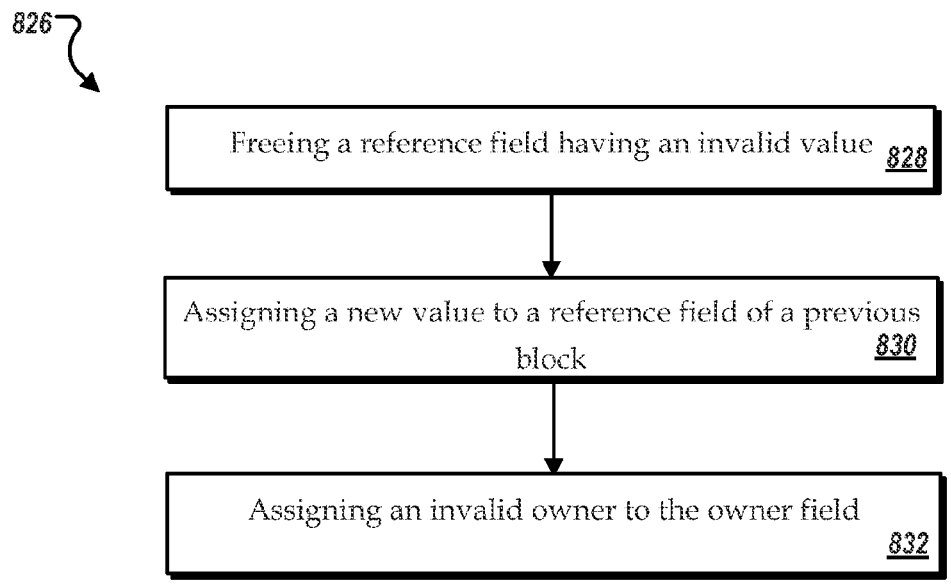

FIG. 8C illustrates exemplary process 826 of releasing a block. A block accessor can assign (828) a reference field using an invalid value when a next block is freed. The block accessor can prevent a block from being freed that has a valid reference field. The block accessor can assign (830) a new value to the reference of the so-far previous block. The block accessor can assign (832) an invalid owner to the owner of the block being released.

Utilizing processes 818 and 826, a block accessor can limit a block B marked with a given owner O to refer only to a block belonging to O at the time block B belonged to O. Any chain of blocks belonging to O can be a chain that exists or has existed in the past. If a given storage unit A is shutdown successfully, where a write barrier caused first all modified sectors and then the header block to be written, A can be guaranteed to refer to all blocks designated to be owned by A. If another storage unit of the storage container's free list are dirty, the dirty flag can indicate that some blocks owned by any storage unit that are marked as free in the free list, or some blocks referred to by the other storage unit have a different owner or no owner.

Figure 8D:
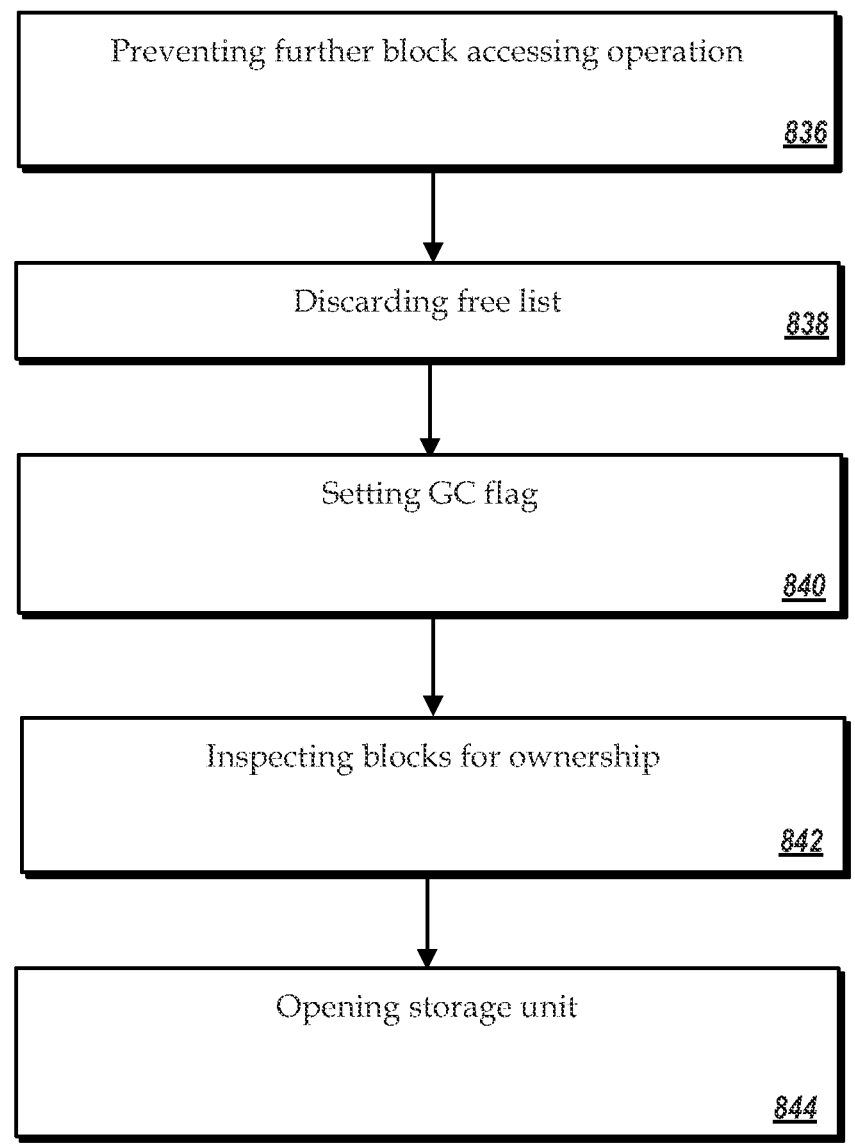

FIG. 8D illustrates exemplary recovery process 834. A file-system based block accessor can perform recovery at storage unit level. A block device block accessor can perform recovery on a storage container when the dirty flag of the storage container is set.

A system can prevent (836) block accessing operation before recovery is completed. The system can discard (838) free list of the block accessor. All blocks can be recorded as occupied. The system can set (840) the garbage collection (GC) flag of the storage container in memory.

The system can inspect (842), or sweep, every block of the storage container. Inspecting the blocks of a storage container can be based on the size and alignment of the blocks for ownership. If owned by no one, the block can added to the free list and the block's GC mark can be cleared. If owned by a storage unit, the GC mark of the block can be set. The storage container's dirty flag can be cleared in memory. The clear dirty flag can be written to the storage container header during a proper shutdown.

The system can open (844) a storage unit. If a storage unit A starts with the dirty flag set, the system can prevent storage unit operation before recovery is complete. The system can clear content in the top index of the storage unit. The system can inspect the blocks of the storage unit, following each block using the reference fields and owner fields. If a block has no owner, then the block can be freed redundantly. If the owner is other than A, then the block can be unlinked from the block's predecessor and can be abandoned, along with all the subsequent ones in the chain. If the owner is A, then the block's GC mark can be cleared. If the block is an index block, the GC mark is cleared. The remaining blocks can be inspected again. The indices can be rebuilt in memory. In some implementations, rebuilding the indices can include uncompressing compressed blocks to determine the amount of uncompressed data that each block represents. The storage unit's dirty flag can be cleared in memory. Since a storage unit can be configured not to use a block that is marked for a different owner, the storage unit can operate normally after being cleaned, even in the presence of dirty storage units. In some implementations, to assure clean recovery, no dirty storage unit is allowed to do anything other than recovering.

Figure 8E:
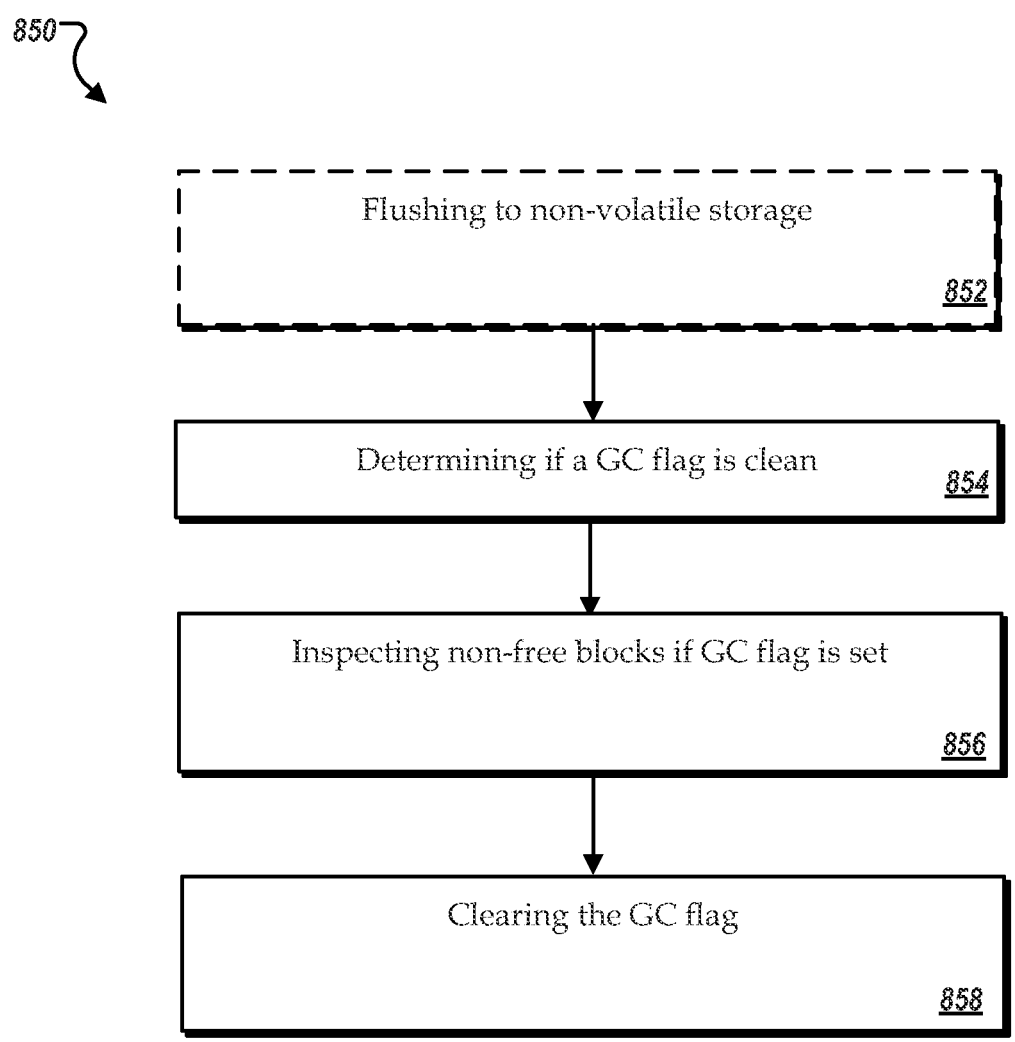

FIG. 8E is a flowchart illustrating exemplary process 850 of garbage collection used in random access data compression. Recovery processes can be prone to leaving unreferenced blocks. The blocks can be recovered after all storage units have identified the blocks that the storage units actually reference. When every relevant storage unit is in a clean state, exemplary process 850 can proceed.

The system can optionally flush (852) unwritten data to non-volatile storage. Flushing the data can reduce total amount of work that garbage collection needs to work on. Flushing unwritten data can occur in any stage of process 850.

A block device block accessor can determine (854) if a storage container's GC flag is clear. If the GC flag is clear, the block device block accessor needs to do nothing. If the GC flag is set, the block device block accessor can inspect (856) all non-free blocks for the GC flag. Every block that has a GC flag set can be freed. The GC flag can be reset. The block device block accessor can clear (858) the GC flag of the storage container.

Exemplary System Architecture

Figure 9:
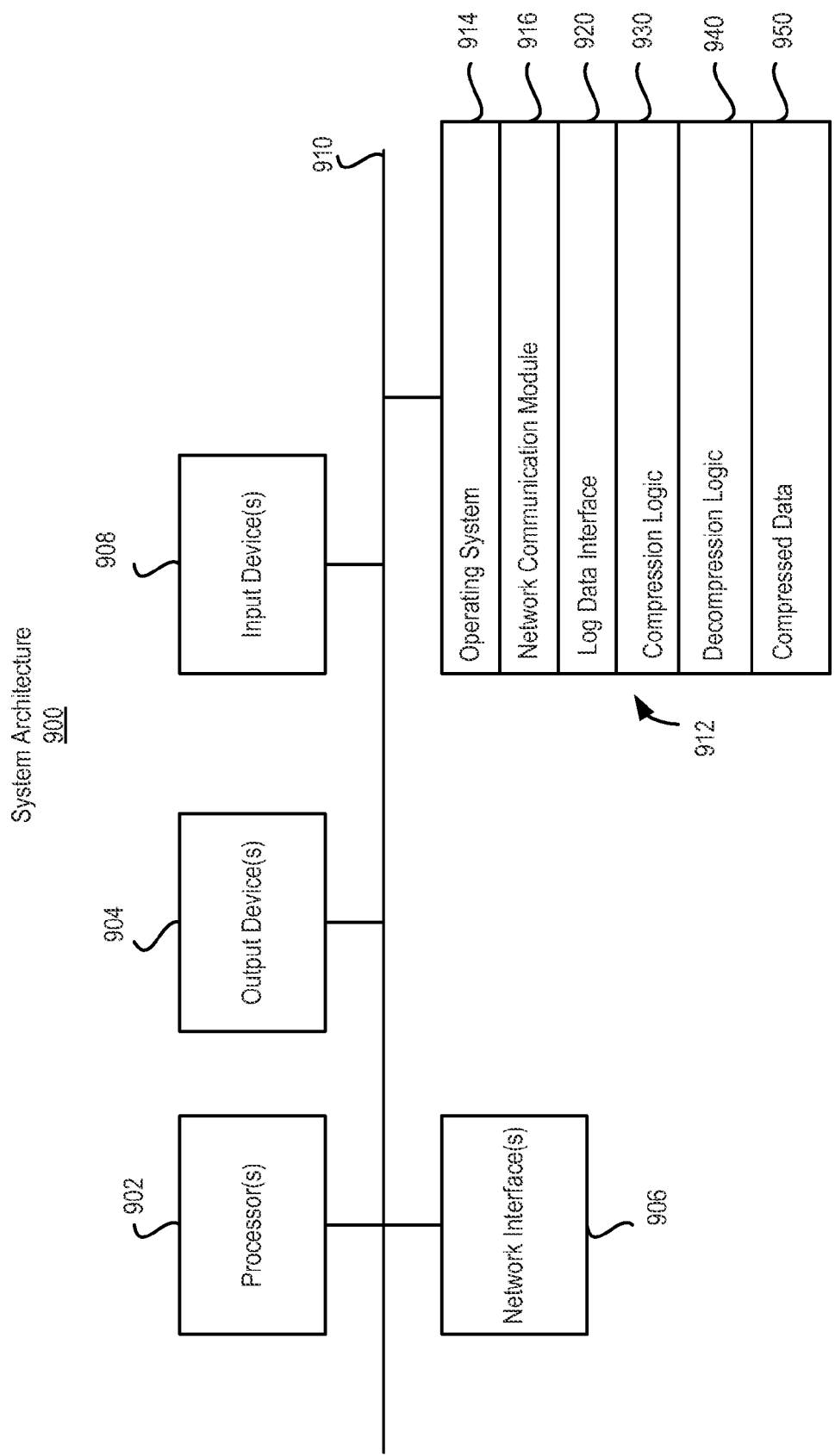
FIG. 9 is a block diagram of an exemplary system architecture for implementing the random access data compression features and operations.

FIG. 9 is a block diagram of an exemplary system architecture 900 for implementing the features and operations of random access data compression techniques. Other architectures are possible, including architectures with more or fewer components. In some implementations, architecture 900 includes one or more processors 902 (e.g., dual-core Intel® Xeon® Processors), one or more output devices 904 (e.g., LCD), one or more network interfaces 906, one or more input devices 908 (e.g., mouse, keyboard, touch-sensitive display) and one or more computer-readable mediums 912 (e.g., RAM, ROM, SDRAM, hard disk, optical disk, flash memory, etc.). These components can exchange communications and data over one or more communication channels 910 (e.g., buses), which can utilize various hardware and software for facilitating the transfer of data and control signals between components.

The term "computer-readable medium" refers to any medium that participates in providing instructions to processor 902 for execution, including without limitation, non-volatile media (e.g., optical or magnetic disks), volatile media (e.g., memory) and transmission media. Transmission media includes, without limitation, coaxial cables, copper wire and fiber optics.

Computer-readable medium 912 can further include operating system 914 (e.g., Mac OS® server, Windows® NT server), network communication module 916, log data interface 920, compression logic 930, decompression logic 940, and compressed data 950. Log data interface 920 can provide one or more interfaces to receive log data from one or more log sources. Compression logic 930 can include mechanism to compress the received log data into randomly accessible data in one or more files. Decompression logic 940 can include mechanism to read the compressed data, including receiving random access requests and responding to the requests. Compressed data 950 can include one or more compressed data files. Each compressed data file can include data compressed using various technologies and uncompressed data.

Operating system 914 can be multi-user, multiprocessing, multitasking, multithreading, real time, etc. Operating system 914 performs basic tasks, including but not limited to: recognizing input from and providing output to devices 904 and 908; keeping track and managing files and directories on computer-readable mediums 912 (e.g., memory or a storage device); controlling peripheral devices; and managing traffic on the one or more communication channels 910. Network communications module 916 includes various components for establishing and maintaining network connections (e.g., software for implementing communication protocols, such as TCP/IP, HTTP, etc.). Database interface 920 can include interface to various databases including relational databases.

Architecture 900 can be included in any device capable of hosting a database application program. Architecture 900 can be implemented in a parallel processing or peer-to-peer infrastructure or on a single device with one or more processors. Software can include multiple software components or can be a single body of code.

The described features can be implemented advantageously in one or more computer program products that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube), LCD (liquid crystal display), or plasma monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network. The relationship of client and server arises by virtue of computer programs running on the respective computers and having a client-server relationship to each other.

A number of implementations of the invention have been described. Nevertheless, it will be understood that various modifications can be made without departing from the spirit and scope of the invention. For example, some values are stored in a big-endian format. Other storage formats are possible. Accordingly, other implementations are within the scope of the following claims.

What is claimed is:

1. A method executed by one or more data processing devices, comprising:
   receiving data to be compressed;
   creating a header block, an index block, and one or more data blocks, each data block including a compressed portion of the received data, the header block including a reference to the index block and a first portion of an index to the one or more data blocks, the index block including a second portion of the index to the one or more data blocks;
   storing the header block in a serialized data structure; and
   storing the one or more data blocks in the serialized data structure after the header block, the first portion of the index indicating a location of each of the one or more data blocks that is located before the index block in the serialized data structure, and the second portion of the index indicating a location of each of the one or more data blocks that is located after the index block in the serialized data structure, wherein the index includes a triplet of values, the values including:
   a first index identifying an uncompressed offset value;

a second index identifying an uncompressed data size; and a third index identifying an offset of a data block.

2. The method of claim 1, where the header block includes a configurable block size of each data block.

3. The method of claim 1, further comprising accessing the serialized data structure to retrieve the data non-sequentially, including:

receiving a request to decompress a section of the data, the request specifying a location of the section in the data before the data were compressed;

identifying a triplet of values, the first index of the triplet of values corresponding to the location specified in the request;

identifying a data block using the third index in the identified triplet of values;

decompressing the identified data block; and identifying the section of the data from the decompressed data block.

4. The method of claim 1, where the index block includes additional triplets of values and a reference to an additional index block, the index block and the additional index block forming a tree data structure for storing references to the one or more data blocks.

5. The method of claim 4, where the received data include a plurality of log messages, each log message including offset information usable for identifying a location of the log message from the one or more data blocks using the triplets of values.

6. The method of claim 4, where the serialized data are stored on a file system and are accessible through a block accessor configured to translate a reference to a point of data to a point of the serialized data stored on the file system.

7. The method of claim 1, where each data block includes a compression identifier identifying a compression mechanism used in compressing the data into the data block.

8. The method of claim 1, where the one or more data blocks include a first data block and a second data block, the first data block including data compressed using a first compression mechanism, the second data block including data compressed using a second compression mechanism that is different from the first compression mechanism.

9. The method of claim 1, where the index is file system independent.

10. The method of claim 1, where storing the one or more data blocks in the data structure after the header block includes storing the one or more data blocks sequentially after the header block.

11. A computer program product stored on a storage device, operable to cause one or more processors to perform operations comprising:

receiving data to be compressed;

creating a header block, an index block, and one or more data blocks, each data block including a compressed portion of the received data, the header block including a reference to the index block and a first portion of an index to the one or more data blocks, the index block including a second portion of the index to the one or more data blocks;

storing the header block in a serialized data structure; and storing the one or more data blocks in the data structure after the header block, the first portion of the index indicating a location of each of the one or more data blocks that is located before the index block in the serialized data structure, and the second portion of the index indicating a location of each of the one or more data blocks that is located after the index block in the serialized data structure, wherein the index includes a triplet of values, the values including:

a first index identifying an uncompressed offset value;

a second index identifying an uncompressed data size; and a third index identifying an offset of a data block.

12. The computer program product of claim 11, where:

the received data include a plurality of log messages, each log message including offset information usable for identifying a location of the log message from the one or more data blocks using the triplets of values.

13. The computer program product of claim 11, where the header block includes a configurable block size of each data block.

14. The computer program product of claim 11, where the index block includes additional triplets of values and a reference to an additional index block, the index block and the additional index block forming a tree data structure for storing references to the one or more data blocks.

15. The computer program product of claim 11, the operations comprising accessing the serialized data structure to retrieve the data non-sequentially, including:

receiving a request to decompress a section of the data, the request specifying a location of the section in the data before the data were compressed;

identifying a triplet of values, the first index of the triplet of values corresponding to the location specified in the request;

identifying a data block using the third index in the identified triplet of values;

decompressing the identified data block; and identifying the section of the data from the decompressed data block.

16. A system comprising:

one or more processors configured to perform operations comprising:

receiving data to be compressed;

creating a header block, an index block, and one or more data blocks, each data block including a compressed portion of the received data, the header block including a reference to the index block and a first portion of an index to the one or more data blocks, the index block including a second portion of the index to the one or more data blocks;

storing the header block in a serialized data structure; and storing the one or more data blocks in the data structure after the header block, the first portion of the index indicating a location of each of the one or more data blocks that is located before the index block in the serialized data structure, and the second portion of the index indicating a location of each of the one or more data blocks that is located after the index block in the serialized data structure, wherein the index includes a triplet of values, the values including:

a first index identifying an uncompressed offset value;

a second index identifying an uncompressed data size; and a third index identifying an offset of a data block.

17. The system of claim 16, where:

the received data includes a plurality of log messages, each log message including offset information usable for identifying a location of the log message from the one or more data blocks using the triplets of values.

18. The system of claim 16, where the header block includes a configurable block size of each data block.

19. The system of claim 16, where the index block includes additional triplets of values and a reference to an additional index block, the index block and the additional index block forming a tree data structure for storing references to the one or more data blocks.

20. The system of claim 16, the operations comprising accessing the serialized data structure to retrieve the data non-sequentially, including:
- receiving a request to decompress a section of the data, the request specifying a location of the section in the data before the data were compressed;
- identifying a triplet of values, the first index of the triplet of values corresponding to the location specified in the request;
- identifying a data block using the third index in the identified triplet of values;
- decompressing the identified data block; and
- identifying the section of the data from the decompressed data block.

* * * * *